United States Patent
Niu et al.

(10) Patent No.: US 9,312,321 B2
(45) Date of Patent: Apr. 12, 2016

(54) DOUBLE-SIDED ORGANIC LIGHT-EMITTING DIODE, AND MANUFACTURING METHOD AND DISPLAY DEVICE THEREOF

(71) Applicants: Beijing Lenovo Software Ltd., Haidian District, Beijing (CN); Lenovo (Beijing) Co., Ltd., Haidian District, Beijing (CN)

(72) Inventors: Quan Niu, Beijing (CN); Fang Xu, Beijing (CN); Ke Shang, Beijing (CN); Guang Yang, Beijing (CN)

(73) Assignees: BEIJING LENOVO SOFTWARE LTD., Haidian District, Beijing (CN); LENOVO (BEIJING) CO., LTD., Haidian District, Beijing (CN)

( * ) Notice: Subject to any disclaimer, the term of this patent is extended or adjusted under 35 U.S.C. 154(b) by 0 days.

(21) Appl. No.: 14/342,218
(22) PCT Filed: Dec. 17, 2012
(86) PCT No.: PCT/CN2012/086768
§ 371 (c)(1),
(2) Date: Feb. 28, 2014
(87) PCT Pub. No.: WO2013/091520
PCT Pub. Date: Jun. 27, 2013

(65) Prior Publication Data
US 2014/0306204 A1 Oct. 16, 2014

(30) Foreign Application Priority Data
Dec. 19, 2011 (CN) .......................... 2011 1 0427958

(51) Int. Cl.
*H01L 27/32* (2006.01)
*H01L 51/56* (2006.01)
(52) U.S. Cl.
CPC ............ *H01L 27/3267* (2013.01); *H01L 51/56* (2013.01); *H01L 27/3248* (2013.01)
(58) Field of Classification Search
CPC .......................... H01L 27/3267; H01L 51/56

USPC ............................ 257/40, 88, 103; 438/23, 34
See application file for complete search history.

(56) References Cited

U.S. PATENT DOCUMENTS 6,815,710 B2 * 11/2004 Tsuchida ........................ 257/40
7,474,047 B2 1/2009 Kim
(Continued)

FOREIGN PATENT DOCUMENTS

CN 1700828 11/2005
CN 1816228 A 8/2006
(Continued)

OTHER PUBLICATIONS

PCT/CN2012/086768 International Preliminary Report on Patentability dated Jun. 24, 2014 (11 pages including English translation).
(Continued)

*Primary Examiner* — Sheng Zhu
(74) *Attorney, Agent, or Firm* — Brinks Gilson & Lione; G. Peter Nichols (57) ABSTRACT

A double-sided organic light-emitting diode and manufacturing method thereof, and a display device using double-sided organic light-emitting diode pixel configuration are described. The double-sided organic light-emitting diode includes a first electrode, a first organic semiconductor layer disposed on the first electrode, a shared electrode disposed on the first organic semiconductor layer and electrically connected to the output terminal of a thin film transistor; a second organic semiconductor layer disposed on the shared electrode, and a second electrode disposed on the second organic semiconductor. The first electrode, the shared electrode and the second electrode are electrically insulated from each other, and two organic light-emitting diodes in the double-sided organic light emitting diode can be independently controlled.

10 Claims, 4 Drawing Sheets

(56) References Cited

U.S. PATENT DOCUMENTS

| 7,564,184 | B2 | 7/2009 | Huang et al. | |
|---|---|---|---|---|
| 2005/0258740 | A1 | 11/2005 | Kim | |
| 2007/0114522 | A1* | 5/2007 | Kwok et al. | 257/40 |
| 2007/0132379 | A1* | 6/2007 | Huang et al. | 313/506 |
| 2010/0308353 | A1* | 12/2010 | Grabowski et al. | 257/89 |

FOREIGN PATENT DOCUMENTS

| CN | 1979915 | 6/2007 |
|---|---|---|
| CN | 102044554 | 5/2011 |

OTHER PUBLICATIONS

PCT/CN2012/086768 International Search Report dated Mar. 7, 2013 (6 pages including English translation).

Chinese First Office Action with English Translation for related Application No. 2011104279585 dated Feb. 28, 2015, 12 pages.

Second Office Action dated Nov. 3, 2015 out of corresponding Chinese priority Application No. 201110427958.5 (6 pages including English translation).

\* cited by examiner

DOUBLE-SIDED ORGANIC LIGHT-EMITTING DIODE, AND MANUFACTURING METHOD AND DISPLAY DEVICE THEREOF

This application claims priority to International Application No. PCT/CN2012/086768 filed Dec. 17, 2012; and Chinese Patent Appln. 201110427958.5 filed Dec. 19, 2011, the entire contents of each are incorporated herein by reference.

BACKGROUND

The embodiments of the present invention relate to a novel organic light-emitting diode, and more particularly, to a double-sided organic light-emitting diode and a method of manufacturing the same and a display device having the double-sided organic light-emitting diode.

In organic light-emitting display techniques of active matrices type (Active Matrix), each display pixel is driven by a dedicated thin film transistor, the corresponding organic light-emitting diode (OLED) is made to emit light by controlling the dedicated thin film transistor (TFT) to be turned on.

Generally, the organic light-emitting diode can be formed as top emitting or bottom emitting OLED. In application scene of double-sided display, a top emitting OLED and a bottom emitting OLED can be arranged side by side corresponding to one pixel. In this case, area corresponding to one pixel (for example, display area occupied on the display screen) is certainly increased, which is not advantageous for increasing resolution of the display device.

Figure 1A:
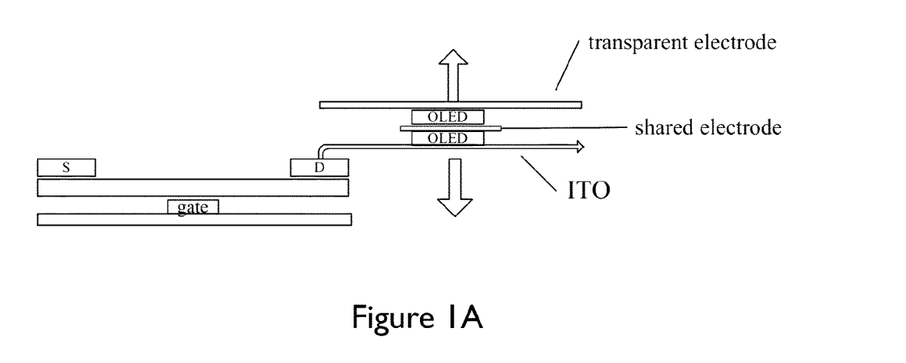
FIG. 1A is a schematic diagram illustrating connection between the drain electrode of the thin film transistor TFT and the anode electrode of the double-sided organic light-emitting diode OLED.

Further, in case that the top emitting sub-OLED and bottom emitting sub-OLED are integrated on a double-sided organic light-emitting diode OLED of a shared electrode by using a shared electrode, generally the TFT and one electrode (generally an anode electrode) of the OLED pixel are integrated together to use the TFT to drive these two OLEDs at the same time, thus, independent control of these two OLEDs can't be implemented. In FIG. IA, it schematically illustrates a schematic structure of such double-sided organic light-emitting diode OLED of the shared electrode.

Therefore, there needs a novel double-sided organic light-emitting diode which can emit light at the both sides and of which the light emitting of each side can be controlled independently.

SUMMARY

The present invention is made in view of above problem, and one purpose of the present invention is to provide a double-sided organic light-emitting diode. The two OLEDs included in the double-sided light-emitting diode can be controlled independently by connecting the shared electrode therein to an output end of the thin film transistor.

According to one aspect of the embodiments of the present invention, there provides a double-sided organic light-emitting diode including: a first electrode; a first organic semiconductor layer arranged on the first electrode; a shared electrode arranged on the first organic semiconductor layer and electrically connected to an output end of a thin film transistor; a second organic semiconductor layer arranged on the shared electrode; and a second electrode arranged on the second organic semiconductor layer, wherein, the first electrode, the shared electrode and the second electrode are electrically isolated from each other.

Preferably, in the double-sided organic light-emitting diode, the first electrode, the first organic semiconductor layer and the shared electrode operate as a first organic light-emitting diode; and the second electrode, the second organic semiconductor layer and the shared electrode operates as a second organic light-emitting diode.

Preferably, the double-sided organic light-emitting diode further includes: a transparent conducting layer electrically connected to the output end of the thin film transistor; and a transparent insulating layer arranged on the transparent conducting layer; the first electrode is arranged on the transparent insulating layer so as to be electrically insulated from the transparent conducting layer; and the shared electrode is electrically connected to the transparent conducting layer.

Preferably, in the double-sided organic light-emitting diode, the area of the transparent insulating layer is less than the area of the transparent conducting layer; the area of the first electrode is less than the area of the transparent insulating layer; the area of the first organic semiconductor layer is larger than the area of the first electrode and less than or equal to the area of the transparent insulating layer; and the area of the shared electrode is larger than the area of the transparent insulating layer and is less than or equal to the area of the transparent conducting layer.

According to another aspect of the present invention, there provides a method for manufacturing the double-sided organic light-emitting diode including: providing a first electrode; arranging a first organic semiconductor layer on the first electrode; arranging a shared electrode on the first organic semiconductor layer and making the shared electrode electrically connected to an output end of the thin film transistor and electrically isolated from the first electrode; arranging a second organic semiconductor layer on the shared electrode; and arranging a second electrode on the second organic semiconductor layer and making the second electrode electrically isolated from the first electrode and the shared electrode.

Preferably, the method further includes: providing a transparent conducting layer and making the transparent conducting layer electrically connected to the output end of the thin film transistor; and arranging a transparent insulating layer on the transparent conducting layer; arranging the first electrode on the transparent insulating layer so as to make the first electrode electrically isolated from the transparent conducting layer; and arranging the shared electrode to be electrically connected to the transparent conducting layer.

Preferably, the transparent conducting layer completely covers the output end of the thin film transistor, and the area of the transparent conducting layer is greater than or equal to the area of the output end of the thin film transistor.

Preferably, in the method, the transparent insulating layer is arranged on a part of the transparent conducting layer, and the area of the transparent insulating layer is less than the area of the transparent conducting layer; the first electrode is arranged on a part of the transparent insulating layer, and the area of the first electrode is less than the area of the transparent insulating layer; the first organic semiconductor layer is arranged on the first electrode to cover the first electrode, and the area of the first organic semiconductor layer is larger than the area of the first electrode and is less than or equal to the area of the transparent insulating layer; and the shared electrode is arranged on the first organic semiconductor layer to cover the first organic semiconductor layer, and the area of the shared electrode is larger than the area of the transparent insulating layer and is less than or equal to the area of the transparent conducting layer.

Preferably, the shared electrode is an opaque reflection layer, and the first electrode and the second electrode are transparent layers.

According to yet another aspect of the embodiment of the present invention, there provides a display device having a pixel array in which each pixel includes a double-sided organic light-emitting diode and a thin film transistor, wherein, the double-sided organic light-emitting diode includes: a first electrode; a first organic semiconductor layer arranged on the first electrode; a shared electrode arranged on the first organic semiconductor layer and electrically connected to an output end of the thin film transistor; a second organic semiconductor layer arranged on the shared electrode; and a second electrode arranged on the second organic semiconductor layer, and, the first electrode, the shared electrode and the second electrode are electrically isolated from each other.

Preferably, in the display device, the double-sided organic light-emitting diode further includes: a transparent conducting layer electrically connected to the output end of the thin film transistor; and a transparent insulating layer arranged on the transparent conducting layer; the first electrode is arranged on the transparent insulating layer so as to be electrically isolated from the transparent conducting layer; and the shared electrode is electrically connected to the transparent conducting layer.

Preferably, in the display device, the area of the transparent insulating layer is less than the area of the transparent conducting layer; the area of the first electrode is less than the area of the transparent insulating layer; the area of the first organic semiconductor layer is larger than the area of the first electrode and less than or equal to the area of the transparent insulating layer; and the area of the shared electrode is larger than the area of the transparent insulating layer and is less than or equal to the area of the transparent conducting layer.

With the double-sided organic light-emitting diode and the method of manufacturing the same and the display device according to the embodiments of the present invention, two OLEDs can be integrated together, and the light-emitting of these two OLEDs can be controlled independently, and the resolution of the display device applying the double-sided organic light-emitting diode as the pixel is ensured at the same time.

BRIEF DESCRIPTION OF THE DRAWINGS

By describing the embodiment of the present invention detailed in combination with the accompanying drawings, the above and other objects, features and advantages of the present invention become more clear, here.

DETAILED DESCRIPTION

The double-sided organic light-emitting diode and the method of manufacturing the same according to the embodiments of the present invention and the electronic device of constructing pixels by using the double-sided organic light-emitting diode according to the embodiments of the present invention are described with reference to the drawings. In the drawing, the same reference number represents same elements throughout. It should be understood that, the embodiments described here are only illustrative, and should not be interpreted as restricting the range of the present invention.

As shown in FIG. 1A, the anode electrode of the double-sided organic light-emitting diode OLED is generally connected to the drain electrode (D) of the TFT (generally, using the indium-tin oxide (ITO) layer as the anode electrode layer), and in this case, independent control of two sub-OLEDs in the double-sided organic light-emitting diode OLED (for example, top emitting sub-OLED and bottom emitting sub-OLED) can't be implemented. Further, in order to make it simplified, the connection of the gate electrode (G) and the source electrode (S) of the TFT are not shown in FIG. 1A, and those skilled in the art can determine the connecting type thereof easily based on commonly known knowledge in the arts.

Figure 1B:
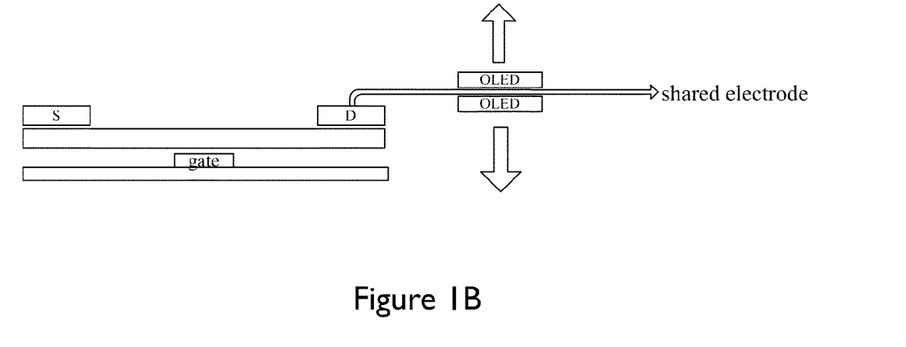
FIG. 1B is a schematic diagram illustrating connecting the drain electrode of the TFT to the shared electrode of the double-sided organic light-emitting diode OLED according to the concept of the present invention.

FIG. 1B schematically illustrates a schematic diagram illustrating connecting the drain electrode of the TFT to the shared electrode of the double-sided organic light-emitting diode OLED according to the concept of the present invention. The double-sided organic light-emitting diode OLED according to the concept of the present invention implements independent control of the two sub-OLEDs of the double-sided organic light-emitting diode by leading out the shared electrodes of the two sub-OLEDs among others (for example, top emitting sub-OLED and bottom emitting sub-OLED) and electrically connecting the shared electrode to the output end of the thin film transistor.

Figure 2A:
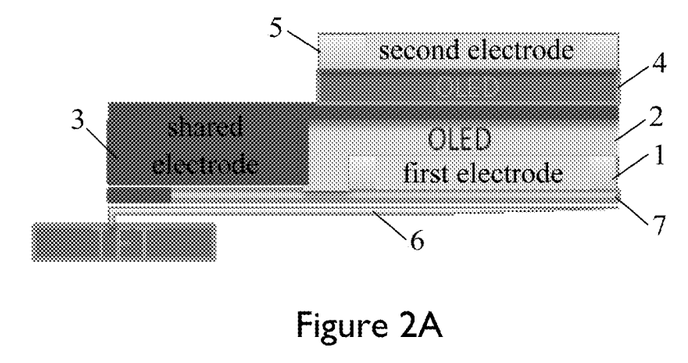
FIG. 2A is a schematic structural diagram of the double-sided organic light-emitting diode according to the embodiment of the present invention.
Figure 2B:
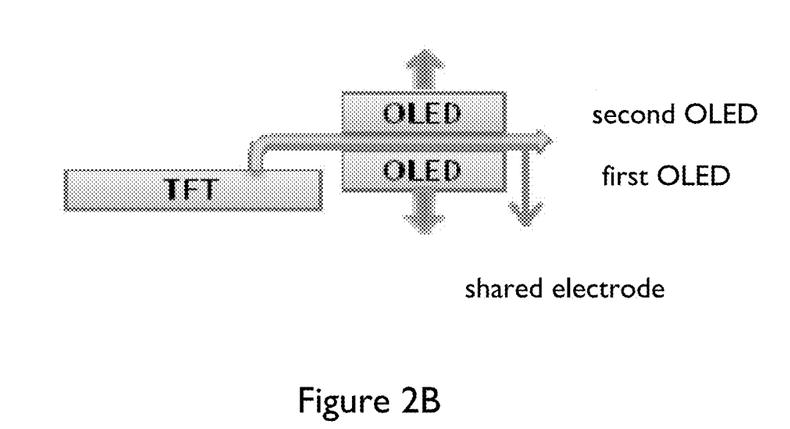
FIG. 2B is a schematic operational diagram of the double-sided organic light-emitting diode shown in FIG. 2A.
Figure 4:
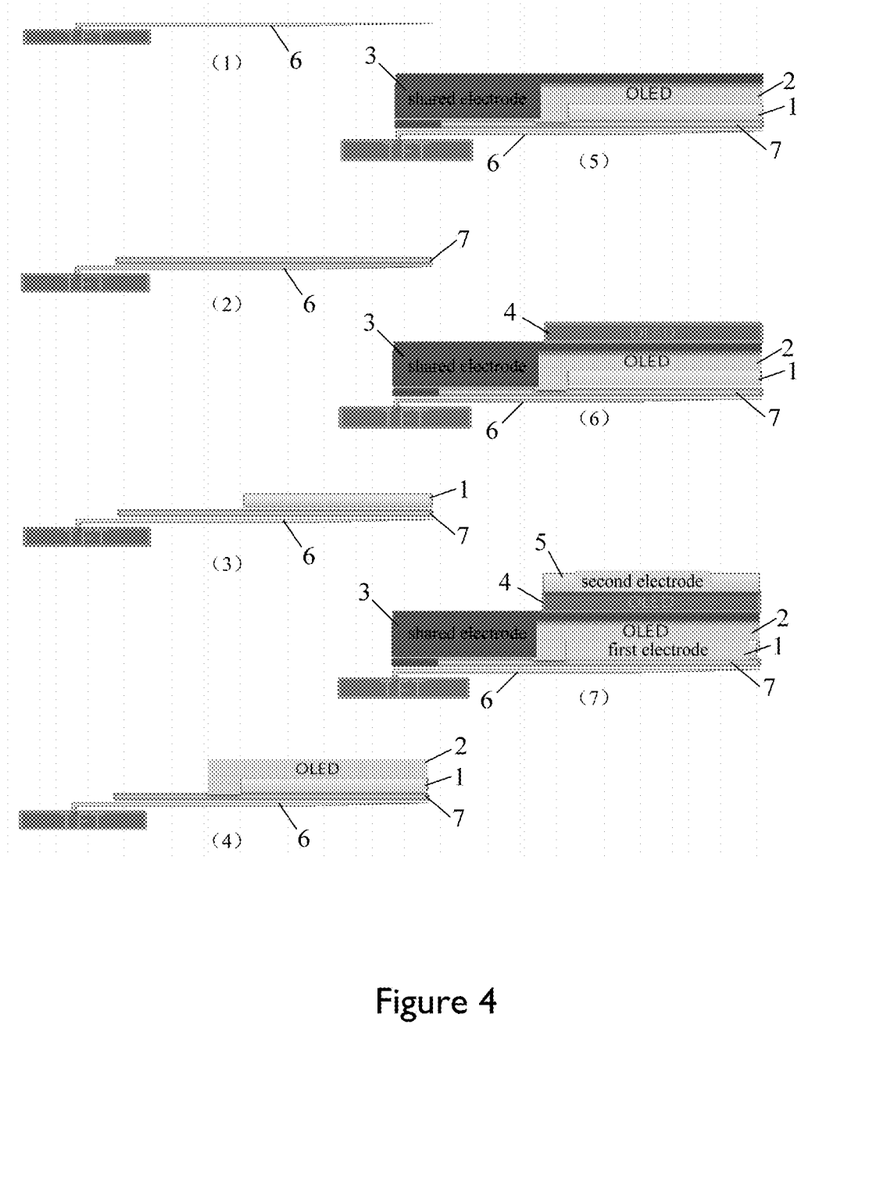
FIG. 4 is a schematic process flow of manufacturing the double-sided organic light-emitting diode according to the embodiments of the present invention.

In FIG. 2 and FIG. 4, the representations of the TFT are simplified, and the gate electrode (G), the source electrode (S) and the drain electrode (D) of the TFT are not shown specifically. However, it should be understood that, the connecting types shown in FIG. 2 and FIG. 4 are made for the drain electrode (D) of the TFT, in other words, the gate electrode and the source electrode of the TFT are not connected to the connection structures in FIG. 2 and FIG. 4.

Further, in the structures shown in FIG. 2 and FIG. 4, it is not proportional, and certain layers among others may be exaggerated, therefore, it should be understood that FIG. 2 and FIG. 4 only schematically illustrate arrangement relationship of the positions of respective layers.

Hereinafter, the structure of the double-sided organic light-emitting diode OLED according to the embodiments of the present invention is described with reference to FIG. 2.

The double-sided organic light-emitting diode OLED includes: a first electrode 1; a first organic semiconductor layer 2; a shared electrode 3; a second organic semiconductor layer 4; and a second electrode 5.

The first organic semiconductor layer 2 is arranged on the first electrode 1. The shared electrode 3 is arranged on the first organic semiconductor layer 2 and is electrically connected to the output end (for example, the drain electrode D) of the thin film transistor TFT.

The second organic semiconductor layer 4 is arranged on the shared electrode 3. The second electrode 5 is arranged on the second organic semiconductor layer 4.

When the double-sided organic light-emitting diode OLED operates, the first electrode 1, the first organic semiconductor layer 2 and the shared electrode 3 operate as a first organic light-emitting diode OLED; and the second electrode 5, the second organic semiconductor layer 4 and the shared electrode 3 operates as a second organic light-emitting diode OLED.

In the double-sided organic light-emitting diode OLED, three electrodes of the first electrode 1, the shared electrode 3 and the second electrode 5 which are electrically isolated from each other are led out. The shared electrode 3 is electrically connected to the output end of the thin film transistor TFT. Further, proper voltage can be applied to the first electrode 1 and the second electrode 5 respectively so as to control the voltage between the first electrode 1 and the shared electrode 3 and the voltage between the second electrode 5 and the shared electrode 3 independently.

Preferably, in order to electrically connect the shared electrode 3 to the output end of the TFT, the double-sided organic light-emitting diode OLED further includes a transparent conducting layer 6 electrically connected to the output end of the TFT and a transparent insulating layer 7 arranged on the transparent conducting layer 6.

The first electrode 1 is arranged on the transparent insulating layer 7, and the transparent insulating layer 7 isolates the first electrode 1 from the transparent conducting layer 6. Further, the shared electrode 3 is electrically connected to the transparent conducting layer 6, so as to implement electrical connection with the output end of the TFT.

In FIG. 2A, in addition to showing layered structure of the double-sided organic light-emitting diode OLED, it also shows a preferable integrated structure of the double-sided organic light-emitting diode OLED and the TFT.

In the integrated structure, the transparent conducting layer 6 is arranged on the output end of the TFT, and covers at least a part of the output end of the TFT. Preferably, the transparent conducting layer 6 completely covers the output end of the TFT, and expands the area of the transparent conducting layer 6 in horizontal direction shown in FIG. 2A (i.e., a plane direction on which the display pixel formed by the double-sided organic light-emitting diode OLED is arranged in order). More preferably, the area of the transparent conducting layer is greater than or equal to the area of the output end of the TFT (for example, the area of the drain electrode of the TFT).

In the double-sided organic light-emitting diode OLED shown in FIG. 2A, the area of the transparent insulating layer 7 is less than the area of the transparent conducting layer 6, and the area of the first electrode 1 is less than the area of the transparent insulating layer 7, so as to make the transparent insulating layer 7 able to isolate the transparent conducting layer 6 from the first electrode 1.

Further, the area of the first organic semiconductor layer 2 is larger than the area of the first electrode 1 and is less than or equal to the area of the transparent insulating layer 7, so as to make the transparent insulating layer 7 able to also isolate the transparent conducting layer 6 from the first organic semiconductor layer 2.

Further, the area of the shared electrode 3 is larger than the area of the transparent insulating layer 7 and is less than or equal to the area of the transparent conducting layer 6, so as to make the shared electrode 3 able to connect to the transparent conducting layer 6.

With the structure shown in FIG. 2A, the shared electrode 3 of the double-sided organic light-emitting diode OLED can be led out and the shared electrode 3 led out can be connected to the output end of the TFT through the transparent conducting layer 6. Thereby, voltages on 3 electrodes of the double-sided organic light-emitting diode OLED can be controlled independently, so as to implement independent control of the two sub-OLEDs in the double-sided organic light-emitting diode OLED (the first OLED and the second OLED in FIG. 2B).

As shown in FIG. 2B, it illustrates schematic diagram when the double-sided organic light-emitting diode OLED shown in FIG. 2A operates.

Further, in order to implement light emitting effect of double-sided light emitting, the shared electrode 3 is formed as an opaque reflection layer, and the first electrode 1 and the second electrode 5 are formed as transparent layers.

Though it is not illustrated in FIG. 2A, it should be understood that the double-sided organic light-emitting diode OLED is arranged on a substrate layer, and that the substrate layer is also transparent.

Further, it should be understood that, only the basic structure necessary for the double-sided organic light-emitting diode OLED is illustrated in FIG. 2A, other layers can be deposited between the respective layers illustrated so as to further improve the performance of the double-sided organic light-emitting diode OLED.

Next, the method 100 for manufacturing the double-sided organic light-emitting diode according to the embodiments of the present invention is described with reference to FIG. 3.

Firstly, the method 100 for manufacturing starts at step S101.

In step S110, the first electrode is provided. The first electrode is a transparent electrode, and is, for example, an indium-tin oxide (ITO) layer or another transparent electrode material layer. For example, the first electrode can be provided by manner of deposition.

Next, in step S120, the first organic semiconductor layer is arranged on the first electrode. For example, the first organic semiconductor layer can be provided by manner of deposition. The first organic semiconductor layer is used as the first light emitting layer.

In step S130, the shared electrode is arranged on the first organic semiconductor layer, and the shared electrode is made electrically connected to the output end of the thin film transistor and electrically isolated from the first electrode. For example, the shared electrode is deposited on the first organic semiconductor layer, and the shared electrode is, for example, an opaque aluminum (Al) or aluminum compound layer.

Next, in step S140, the second organic semiconductor layer is arranged on the shared electrode. For example, the second organic semiconductor layer can be provided by manner of deposition. The second organic semiconductor layer is used as a second light emitting layer.

Then, in step S150, the second electrode is arranged on the second organic semiconductor layer, and the second electrode is made electrically isolated from the first electrode and the shared electrode. The second electrode is a transparent electrode, and is, for example, an indium-tin oxide (ITO) layer or another transparent electrode material layer. For example, the second organic semiconductor layer can be provided by manner of deposition.

At last, the method 100 for manufacturing the double-sided organic light-emitting diode according to the embodiments of the present invention ends in step S199.

As above mentioned, the shared electrode is opaque, and it separates the light emitted from the first organic semiconductor layer and the light emitted from the second organic semiconductor layer. Therefore, the light emitted from the first organic semiconductor layer transmits the first electrode, and the light emitted from the second organic semiconductor layer transmits the second electrode, so as to implement double-sided light emitting. By selecting the material of the first organic semiconductor layer and the second organic semiconductor layer properly and/or by adjusting the voltage across the first organic semiconductor layer and the voltage across the second organic semiconductor layer properly, the color and brightness of the light emitting can be selected.

Figure 3:
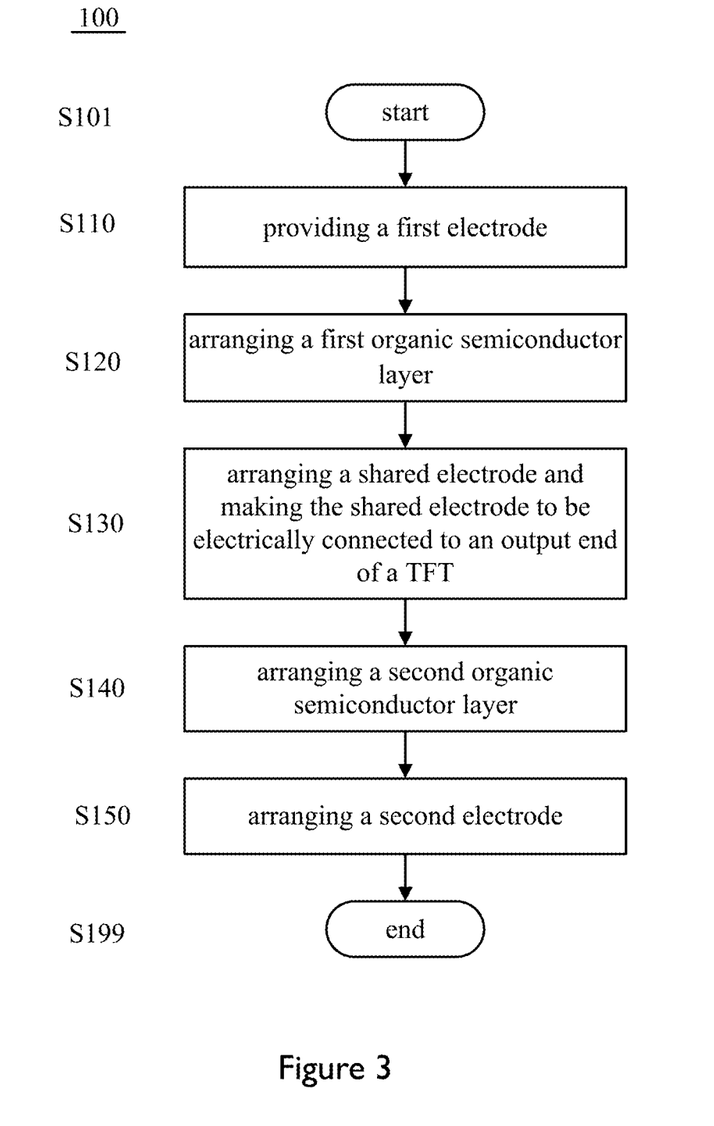
FIG. 3 is a flow chart illustrating the method for manufacturing the double-sided organic light-emitting diode according to the embodiments of the present invention.

Further, preferably, in order to electrically connect the shared electrode and the output end of the TFT, the method for manufacturing the double-sided organic light-emitting diode OLED further includes steps S102 and S105 (not shown in FIG. 3).

In step S102, the transparent conducting layer is provided, and the transparent conducting layer is made electrically connected to the output end of the thin film transistor. The transparent conducting layer is, for example, an indium-tin oxide (ITO) layer or another transparent electrode material layer having good electronic migration. Preferably, as shown in (1) of FIG. 4, the transparent conducting layer is integrated together with the output end of the TFT.

In S105, the transparent insulating layer is arranged on the transparent conducting layer. For example, the transparent insulating layer can be provided by manners of deposition or rotational coating.

Thereby, by the above-described method for manufacturing, the first electrode and the second electrode are generated, and power can be supplied to the first electrode and the second electrode from outside, while power supply to the shared electrode is also implemented by integrating the output end of the TFT and the shared electrode together. Therefore, the voltage between the first electrode and the shared electrode and the voltage between the second electrode and the shared electrode can be controlled independently.

Advantageously, the transparent conducting layer covers at least a part of the output end of the TFT. Preferably, the transparent conducting layer completely covers the output end of the TFT, and the area of the transparent conducting layer is larger than or equal to the area of the output end of the TFT (for example, the area of the drain electrode of the TFT).

Preferably, the transparent insulating layer is arranged on a part of the transparent conducting layer, and the area of the transparent insulating layer is less than the area of the transparent conducting layer; the first electrode is arranged on a part of the transparent insulating layer, and the area of the first electrode is less than the area of the transparent insulating layer, so as to make the transparent insulating layer able to isolate the transparent conducting layer from the first electrode.

Preferably, the first organic semiconductor layer is arranged on the first electrode to cover the first electrode, and the area of the first organic semiconductor layer is larger than the area of the first electrode and is less than or equal to the area of the transparent insulating layer, so as to make the transparent insulating layer able to isolate the transparent conducting layer from the first organic semiconductor layer.

Further, the shared electrode is arranged on the first organic semiconductor layer to cover the first organic semiconductor layer, and the area of the shared electrode is larger than the area of the transparent insulating layer and is less than or equal to the area of the transparent conducting layer, so as to make the shared electrode able to connect to the transparent conducting layer.

Next, process for manufacturing the double-sided organic light-emitting diode OLED according to the embodiments of the present invention is described in more detail with reference to FIG. 4.

As shown in (1) of FIG. 4, for example, ITO layer or other transparent conductive material layers is integrated with the output end of the TFT. For example, the transparent conducting layer is provided by depositing the ITO layer or other transparent conductive material layer on the transparent substrate.

As shown in (2) of FIG. 4, the transparent insulating layer is deposited or rotationally coated on the transparent conducting layer, and the transparent insulating layer only covers a part of the transparent conducting layer.

As shown in (3) of FIG. 4, a transparent electrode material layer is deposited on the transparent insulating layer as the first electrode layer. The transparent electrode material layer only covers a part of the transparent insulating layer. The first electrode layer is, for example, the ITO layer or another transparent conductive material layer.

As shown in (4) of FIG. 4, the first organic semiconductor layer is deposited on the first electrode, and the first organic semiconductor layer completely covers or envelops the first electrode layer and covers a part of the transparent insulating layer. The area of the first organic semiconductor layer is larger than the area of the first electrode and is less than or equal to the area of the transparent insulating layer.

It should be noted that, as known by those skilled in the art, the first semiconductor layer itself includes multi-layers, for example, a cavity transport layer (HTL), a light emitting layer (EL), an electron transport layer (ETL).

As shown in (5) of FIG. 4, the shared electrode layer is deposited on the first semiconductor layer, and the shared electrode layer completely covers or envelops the first semiconductor layer and covers a part of the transparent electrode layer. The shared electrode layer is an opaque conducting layer, and it is, for example, aluminum or aluminum compound. The area of the shared electrode is larger than the area of the transparent insulating layer and is less than or equal to the area of the transparent conducting layer.

As shown in (6) of FIG. 4, the second organic semiconductor layer is deposited on the shared electrode layer, and the second organic semiconductor layer covers a part of the shared electrode layer. The area of the second organic semiconductor layer is less than or equal to the area of the shared electrode layer.

Similarly, the second semiconductor layer itself includes multi-layers, for example, a cavity transport layer (HTL), a light emitting layer (EL), an electron transport layer (ETL).

As shown in (7) of FIG. 4, the transparent electrode material layer is deposited on the second organic semiconductor layer as the second electrode layer, the area of the second electrode layer is less than or equal to the area of the second organic semiconductor layer.

By selecting the electrode material of the first electrode, the electrode material of the shared electrode, the electrode material of the second electrode, the polarity of the voltage applied between the first electrode and the shared electrode and the polarity of the voltage applied between the second electrode and the shared electrode properly, the double-sided organic light-emitting diode is formed specifically, for example:

1) in the first electrode and the shared electrode, the electrode materials of the first electrode and the shared electrode are selected so that the first electrode (for example, ITO) is used as a transparent anode and the shared electrode (for example, Al) is used as an opaque cathode, the first organic semiconductor layer emits light when the potential of the voltage applied on the first electrode is higher than the potential of the voltage applied on the shared electrode;

2) in the second electrode and the shared electrode, the electrode materials of the second electrode and the shared electrode are selected so that the second electrode (for example, ITO) is used as the transparent anode and the shared electrode (for example, Ag) is used as the opaque cathode, the second organic semiconductor layer emits light when the potential of the voltage applied on the second electrode is higher than the potential of the voltage applied on the shared electrode;

3) in the first electrode and the shared electrode, the electrode materials of the first electrode and the shared electrode are selected so that the first electrode is used as a transparent cathode and the shared electrode is used as an opaque anode, the first organic semiconductor layer emits light when the potential of the voltage applied on the first electrode is lower than the potential of the voltage applied on the shared electrode;

4) in the second electrode and the shared electrode, the electrode materials of the second electrode and the shared electrode are selected so that the second electrode is used as the transparent cathode and the shared electrode is used as an opaque anode, the second organic semiconductor layer emits light when the potential of the voltage applied on the second electrode is lower than the potential of the voltage applied on the shared electrode.

The above-described four cases can be combined arbitrarily as necessary, and the embodiments of the present invention do not limit to specific selection of cathode and anode.

Further, the embodiments of the present invention further provides a display device having a pixel array in which each pixel includes the double-sided organic light-emitting diode and the thin film transistor. The organic light-emitting diode has the above described structure. Advantageously, the transparent conducting layer in the double-sided organic light-emitting diode is integrated together with the output end of the thin film transistor.

The double-sided organic light-emitting diode according to the embodiments of the present invention integrates the two OLEDs together, and the light-emitting of these two OLEDs can be controlled independently, and the resolution of the display device applying the double-sided organic light-emitting diode as the pixel is ensured at the same time.

Though some embodiments of the present invention are described with reference to the accompanying drawings here, it should be understood that the embodiments are only examples and are not restrictive. Those skilled in the art should understand that these exemplary embodiments can be made various modifications on form and detail without departing from the scope of spirit of the present invention defined by the claims and the equivalent.

The invention claimed is:

1. A double-sided organic light-emitting diode comprising:
a transparent conducting layer electrically connected to an output end of a thin film transistor;
a transparent insulating layer arranged on the transparent conducting layer;
a first electrode arranged on the transparent insulating layer and electrically isolated from the transparent conducting layer;
a first organic light-emitting semiconductor layer arranged on the first electrode;
a shared electrode arranged on the first organic light-emitting semiconductor layer and electrically connected to the transparent conducting layer;
a second organic light-emitting semiconductor layer arranged on the shared electrode; and
a second electrode arranged on the second organic light-emitting semiconductor layer,
wherein, the first electrode, the shared electrode and the second electrode are electrically isolated from each other, the first electrode, the first organic light-emitting semiconductor layer and the shared electrode operate as a first organic light-emitting diode; and the second electrode, the second organic light-emitting semiconductor layer and the shared electrode operate as a second organic light-emitting diode,
wherein the shared electrode is an opaque reflection layer and the first electrode and the second electrode are transparent layers.

2. The double-sided organic light-emitting diode according to claim 1, wherein,
the area of the transparent insulating layer is less than the area of the transparent conducting layer;
the area of the first electrode is less than the area of the transparent insulating layer;
the area of the first organic light-emitting semiconductor layer is larger than the area of the first electrode and is less than or equal to the area of the transparent insulating layer; and
the area of the shared electrode is larger than the area of the transparent insulating layer and is less than or equal to the area of the transparent conducting layer.

3. A display device having pixel array in which each pixel includes a double-sided organic light-emitting diode and a thin film transistor,
wherein, the double-sided organic light-emitting diode includes:
a transparent conducting layer electrically connected to an output end of the thin film transistor;
a transparent insulating layer arranged on the transparent conducting layer;
a first electrode arranged on the transparent insulating layer and electrically isolated from the transparent conducting layer;
a first organic light-emitting semiconductor layer arranged on the first electrode;
a shared electrode arranged on the first organic light-emitting semiconductor layer and electrically connected to the transparent conducting layer;
a second organic light-emitting semiconductor layer arranged on the shared electrode; and
a second electrode arranged on the second organic light-emitting semiconductor layer,
the first electrode, the shared electrode and the second electrode are electrically isolated from each other,
wherein the first electrode, the first organic light-emitting semiconductor layer and the shared electrode operate as a first organic light-emitting diode; and the second electrode, the second organic light-emitting semiconductor layer and the shared electrode operate as a second organic light-emitting diode.

4. The display device according to claim 3, wherein,
the area of the transparent insulating layer is less than the area of the transparent conducting layer;
the area of the first electrode is less than the area of the transparent insulating layer;
the area of the first organic light-emitting semiconductor layer is larger than the area of the first electrode and is less than or equal to the area of the transparent insulating layer; and
the area of the shared electrode is larger than the area of the transparent insulating layer and is less than or equal to the area of the transparent conducting layer.

5. The display device according to claim 3, wherein, the transparent conducting layer covers at least a part of the output end of the thin film transistor and is electrically connected to the output end of the thin film transistor.

6. The display device according to claim 5, wherein, the transparent conducting layer covers on the output end of the thin film transistor and the area of the transparent conducting layer is larger than or equal to the area of the output end of the thin film transistor.

7. A method for manufacturing a double-sided organic light-emitting diode comprising:
- providing a transparent conducting layer and electrically connecting the transparent conducting layer to an output end of a thin film transistor;
- arranging a transparent insulating layer on the transparent conducting layer;
- providing a first electrode on the transparent insulating layer so that the first electrode is electrically isolated from the transparent conducting layer;
- arranging a first organic light-emitting semiconductor layer on the first electrode;
- arranging a shared electrode on the first organic light-emitting semiconductor layer and making the shared electrode electrically connected to an output end of a thin film transistor and electrically isolated from the first electrode;
- arranging a second organic light-emitting semiconductor layer on the shared electrode; and
- arranging a second electrode on the second organic light-emitting semiconductor layer and making the second electrode electrically isolated from the first electrode and the shared electrode,
- wherein the first electrode, the first organic light-emitting semiconductor layer and the shared electrode operate as a first organic light-emitting diode; and the second electrode, the second organic light-emitting semiconductor layer and the shared electrode operate as a second organic light-emitting diode, and the shared electrode is an opaque reflection layer and the first electrode and the second electrode are transparent layers.

8. The method according to claim 7, wherein, the transparent conducting layer covers on at least a part of the output end of the thin film transistor.

9. The method according to claim 8, wherein, the transparent conducting layer completely covers the output end of the thin film transistor and the area of the transparent conducting layer is larger than or equal to the area of the output end of the thin film transistor.

10. The method according to claim 7, wherein,
- the transparent insulating layer is arranged on a part of the transparent conducting layer, and the area of the transparent insulating layer is less than the area of the transparent conducting layer;
- the first electrode is arranged on a part of the transparent insulating layer and the area of the first electrode is less than the area of the transparent insulating layer;
- the first organic light-emitting semiconductor layer is arranged on the first electrode to cover the first electrode and the area of the first organic light-emitting semiconductor layer is larger than the area of the first electrode and is less than or equal to the area of the transparent insulating layer; and
- the shared electrode is arranged on the first organic light-emitting semiconductor layer to cover the first organic light-emitting semiconductor layer and the area of the shared electrode is larger than the area of the transparent insulating layer and is less than or equal to the area of the transparent conducting layer.

* * * * *